United States Patent
Baumgartner et al.

(10) Patent No.: US 6,247,015 B1
(45) Date of Patent: Jun. 12, 2001

(54) METHOD AND SYSTEM FOR COMPRESSING FILES UTILIZING A DICTIONARY ARRAY

(75) Inventors: Jason Raymond Baumgartner; Nadeem Malik; Steven Leonard Roberts, all of Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/148,828

(22) Filed: Sep. 8, 1998

(51) Int. Cl.[7] ................................................. G06F 17/30
(52) U.S. Cl. .............................................................. 707/101
(58) Field of Search ................................... 707/101, 100, 707/6, 531, 532, 102; 341/50, 51, 106, 107, 57, 52; 382/232

(56) References Cited

U.S. PATENT DOCUMENTS

| | | | |
|---|---|---|---|
| 5,473,326 | * 12/1995 | Harrington et al. | 341/51 |
| 5,530,645 | * 6/1996 | Chu | 707/532 |
| 5,729,228 | * 3/1998 | Franaszek et al. | 341/106 |
| 5,815,096 | * 9/1998 | Smith | 341/51 |
| 5,838,963 | * 11/1998 | Griffiths | 707/6 |
| 5,841,376 | * 11/1998 | Hayashi | 341/51 |
| 5,956,724 | * 9/1999 | Griffiths | 707/101 |
| 5,974,179 | * 10/1999 | Caklovic | 382/232 |
| 6,075,470 | * 6/2000 | Little et al. | 341/107 |

* cited by examiner

*Primary Examiner*—Hosain T. Alam
*Assistant Examiner*—Sanjiv Shah
(74) *Attorney, Agent, or Firm*—Leslie A. VanLeeuwen; Bracewell & Patterson, L.L.P.

(57) ABSTRACT

A method for compressing files utilizing a dictionary within a data-processing system is disclosed. A binary file commonly available to a data-compressing system during compression and to a data-decompressing system during decompression can be served as a dictionary file. A first dictionary array is initially generated utilizing the dictionary file. Each entry within the first dictionary array includes a set of unique bit patterns from the dictionary file. An input file is parsed into multiple blocks, with each block having the same length as each entry within the first dictionary array. The input file is then compared against the first dictionary array, and each entry within the first dictionary array that includes the same bit patterns as a block from the input file is marked accordingly. A second dictionary array that includes all the marked entries from the first dictionary array is subsequently generated, and this second dictionary array is utilized in the compression of the input file. During compression, any block from the input file having a bit pattern found in the second dictionary array will be replaced by a corresponding index to the second dictionary array.

18 Claims, 5 Drawing Sheets

METHOD AND SYSTEM FOR COMPRESSING FILES UTILIZING A DICTIONARY ARRAY

BACKGROUND OF THE INVENTION

1. Technical Field

The present invention relates to a method and system for data processing in general, and in particular to a method and system for compressing files. Still more particularly, the present invention relates to a method and system for compressing files utilizing a dictionary array.

2. Description of the Prior Art

Dictionary-based compression algorithms that are derived from the classical Lempel-Ziv scheme find their applications in various compression software, ranging from the age-old UNIX "compress" utility to the more recent gzip, pkzip, and winzip compression programs. In a dictionary-based compression algorithm, an input file is typically examined sequentially on a byte by byte basis for unique patterns. Each unique pattern found in the input file is then stored in a dictionary in association with a compact label. During the course of the examination of the input file, when a repeat pattern is found, the repeat pattern will be replaced by its corresponding compact label. Accordingly, the more repeat patterns that are found in the input file, the higher the compression ratio will be. The sequence of data, including compact labels, is subsequently stored along with the dictionary as a compressed file. To decompress the file, each compact label in the compressed file is located in the dictionary, and the corresponding pattern is inserted into the file in lieu of the compact label, thus restoring the compressed file back to its original form.

Because the dictionary is stored along with the data as part of the compressed file in the dictionary-based approach, the size of the dictionary is the limiting factor for achieving a good compression ratio. In fact, the dictionary size is such a dominating factor to the compression efficiency that a compression ratio of better than 50% is generally unachievable with randomly chosen binary files. Another drawback associated with the dictionary-based approach is that the overhead for writing and reading the dictionary to perform the compression and decompression, respectively, is relatively large.

With the ever increasing demand in data throughput rates in today's information age, data compactness is very important. For example, in applications such as palm-top computers or personal digital assistants where the space for data storage is rather limited, it is very crucial to have a relatively high data compression ratio for data that can be stored in a compressed form. As a result, any improvement in compression ratio to yield a more compact form of data for storage and transmission can result in a considerable competitive advantage. Consequently, it would be desirable to provide an improved dictionary-based method for compressing files within a data-processing system.

SUMMARY OF THE INVENTION

In accordance with a method of the present invention, a binary file commonly available to a data-compressing system during compression and to a data-decompressing system during decompression can serve as a dictionary file. A first dictionary array is initially generated utilizing the dictionary file. Each entry within the first dictionary array includes a set of unique bit patterns from the dictionary file. An input file is parsed into multiple blocks, with each block having the same length as each entry within the first dictionary array. The input file is then compared against the first dictionary array, and each entry within the first dictionary array that includes the same bit patterns as a block from the input file is marked accordingly. A second dictionary array that includes all the marked entries from the first dictionary array is subsequently generated, and this second dictionary array is utilized in the compression of the input file. During compression, any block from the input file having a bit pattern found in the second dictionary array will be replaced by a corresponding index to the second dictionary array.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein:

FIG. 1b is a high-level flow diagram of a method for compressing an input file by utilizing the first dictionary array generated by the method shown in FIG. 1a, in accordance with a preferred embodiment of the present invention;

DETAILED DESCRIPTION OF A PREFERRED EMBODIMENT

As mentioned above, a dictionary is stored along with the data as part of a compressed file when a dictionary-based compression scheme is being utilized. Hence, one of the objects of the present invention is to ensure the size of the dictionary to be as small as possible. To that end, a binary file commonly available to a data-compressing system during compression and to a data-decompressing system during decompression is chosen to serve as a dictionary file, in accordance with a preferred embodiment of the present invention. The binary file can literally be any type of binary file including an application program file and an operating system component file, as long as the binary file is available to both the data-compressing system and the data-decompressing system. The chosen dictionary file is then sent to a parsing process that identifies all unique bit patterns of a given length to yield a first dictionary array.

Figure 1A:
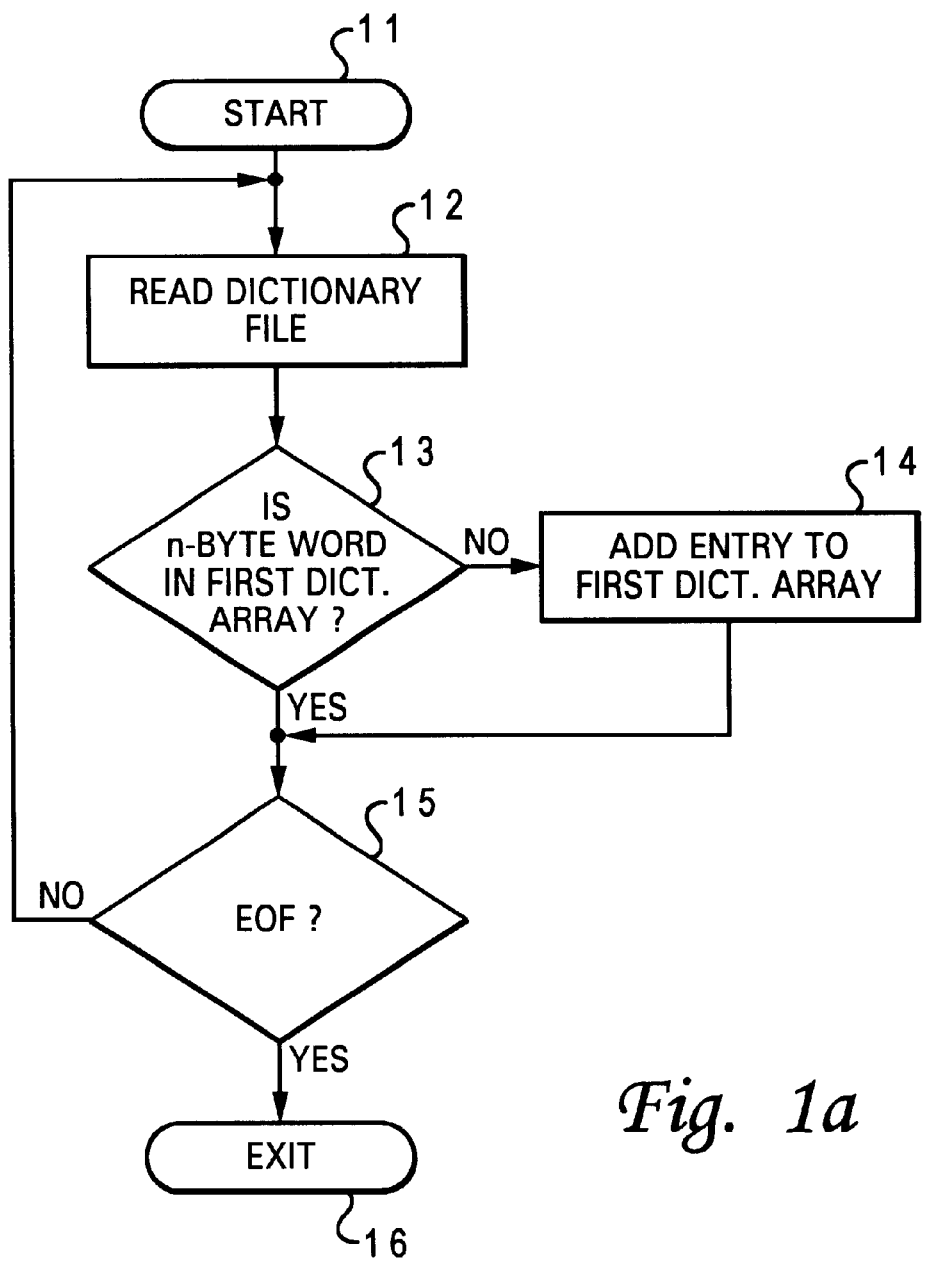
FIG. 1a is a high-level flow diagram of a method for generating a first dictionary array in accordance with a preferred embodiment of the present invention.
Figure 16:
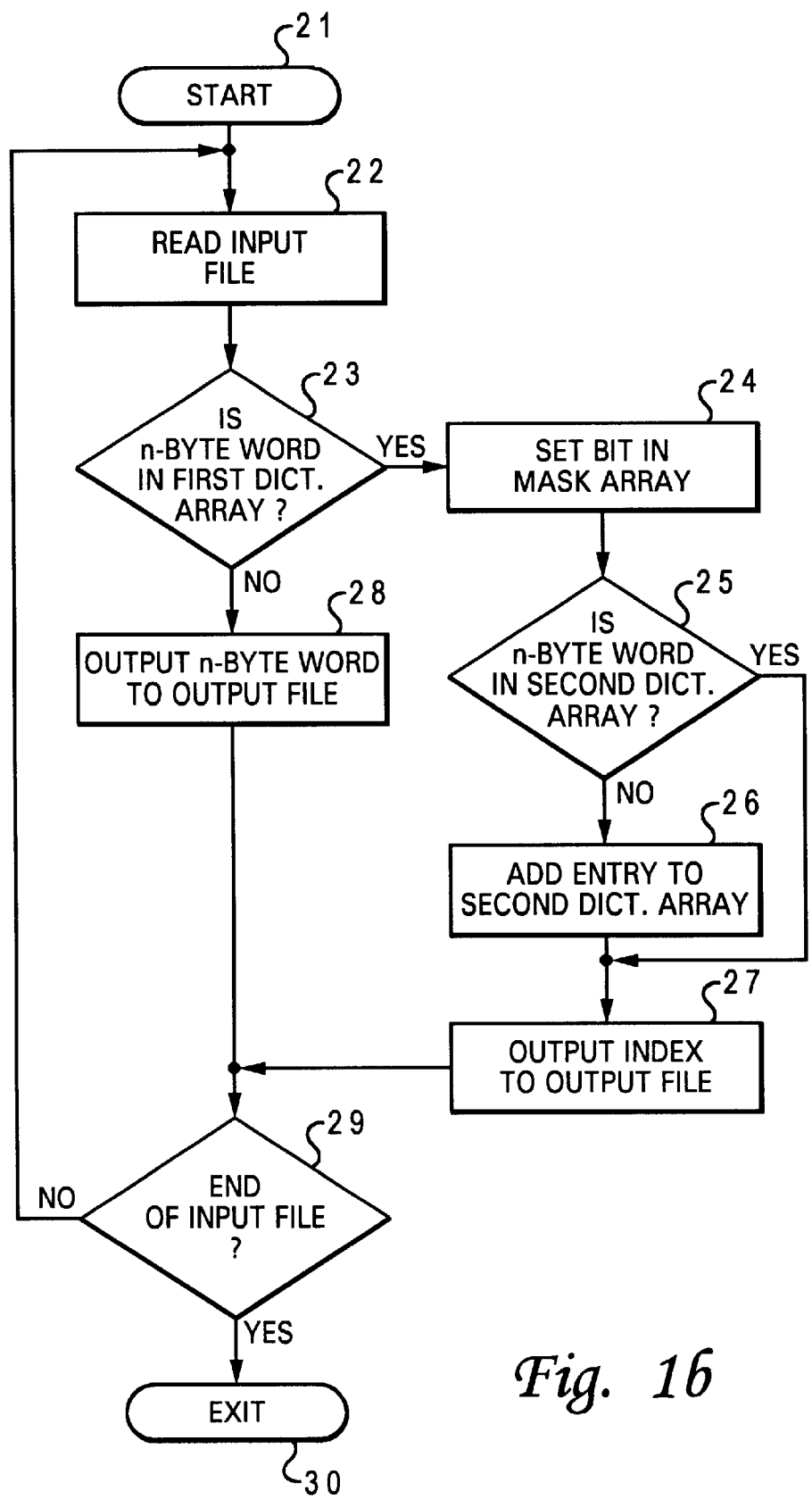

Referring now to the drawings and in particular to FIG. 1a, there is illustrated a high-level flow diagram of a method for generating a first dictionary array in accordance with a preferred embodiment of the present invention. Starting at block 11, an n-byte word is read from a dictionary file, as shown in block 12. A determination is then made as to whether or not the n-byte word is already present in a first dictionary array, as depicted in block 13. If the n-byte word is not present in the first dictionary array, the n-byte word is added as an entry to the first dictionary array, as illustrated in block 14. Otherwise, if the n-byte word already exists in the first dictionary array, another determination is made as to whether or not the end of the dictionary file has been reached, as shown in block 15. If the end of the dictionary file has not been reached, the process returns to block 12; otherwise, the process exits at block 16. At this point, the generation of the first dictionary array is completed. Each entry within the first dictionary array is n bytes in length and is unique.

Similar to the dictionary file, the input file is also parsed into multiple n-byte blocks. The bit patterns within each block of the input file are then compared to all the entries within the first dictionary array to yield a mask array and a secondary dictionary array. The mask array is a bit vector denoting each entry within the first dictionary array having bit patterns that are also found in the parsed input file. In other words, each bit in the mask array indicates the words that are the actual "hits" from the first dictionary array for the parsed input file. The second dictionary array is a condensed version of the first dictionary array in the sense that the second dictionary array includes only the "hit" entries from the first dictionary array with respect to the parsed input file.

During the compression process, a block of bit patterns read from the parsed input file is searched for a match within the second dictionary array. In this preferred embodiment, because the second dictionary array includes only the "hit" entries from the first dictionary array with respect to the parsed input file, there is always a match. Once a match is found, the bit patterns from the block will be replaced by an index to the second dictionary array. Thus, the bit patterns are represented in the output file by an index that is relatively shorter in length. In the event that a set of bit patterns in the input file is not found in the second dictionary array, the compression algorithm then sends the set of bit patterns, without any alteration, to the output file. Thus, the compressed output file includes blocks of bit patterns interleaved with indices to the second dictionary array.

Referring now to FIG. 1b, there is illustrated a high-level flow diagram of a method for compressing an input file utilizing the first dictionary array generated by the method depicted in FIG. 1a, in accordance with a preferred embodiment of the present invention. Starting at block 21, an n-byte word is read from the input file, as shown in block 22. A determination is then made as to whether or not the n-byte word is already present in the first dictionary array, as depicted in block 23. If the n-byte word is already present in the first dictionary array, an entry in a mask array that corresponds to the entry in the first dictionary array in which the n-byte word is stored will be set, preferably to a logical "1," as shown in block 24. Another determination is then made as to whether or not the n-byte word also exists in a second dictionary array, as illustrated in block 25. If the n-byte word is not present in the second dictionary array, the n-byte word is added as an entry to the second dictionary array, as shown in block 26; otherwise, if the n-byte word is already present in the second dictionary array, an index corresponding to the n-byte word within the second dictionary array is sent to an output file, as depicted in block 27.

If, however, the n-byte word is not present in the first dictionary array, the n-byte word is sent to the output file without any alteration, as shown in block 28. Finally, a determination is made as to whether or not the end of the input file has been reached, as shown in block 29. If the end of the input file has not been reached, the process returns to block 22; otherwise, the process exits at block 30. At this point, a compressed output file having blocks of bit patterns from the input file interleaved with indices to the second dictionary array has been generated.

Because a data-decompressing system needs to know which binary file to use for generating a first dictionary array during decompression of the compressed output file, a header can be incorporated within the compressed output file indicating a unique signature or a base address of the binary file to be utilized during compression. In addition, other types of information identifying the common binary file that are known to those skilled in the art can also be incorporated within the compressed output file to insure the same binary file will be utilized during both compression and decompression.

Figure 2:
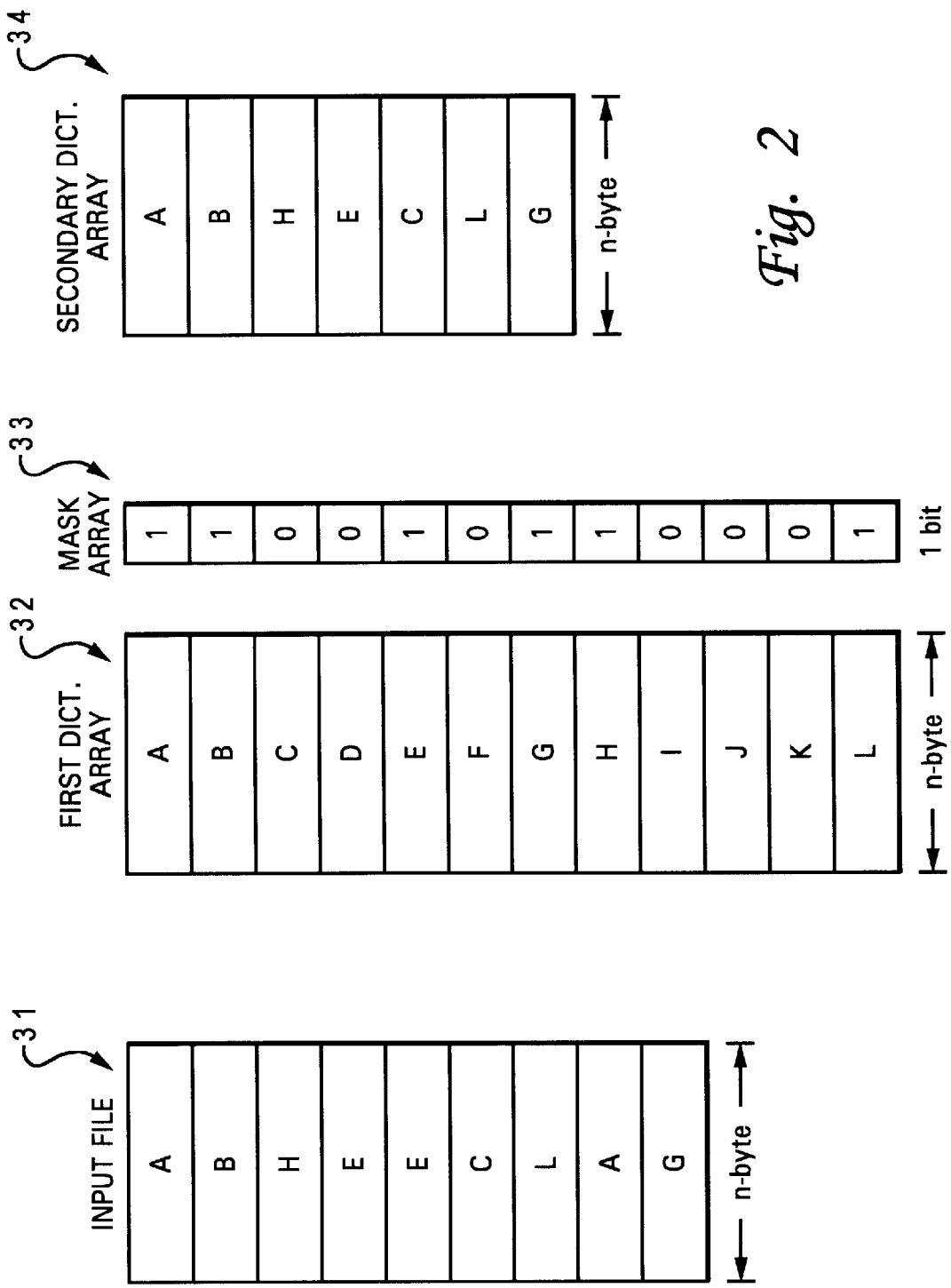
FIG. 2 depicts an exemplary input file and several exemplary arrays, in accordance with a preferred embodiment of the present invention.

With reference now to FIG. 2, there is depicted an exemplary input file and several exemplary arrays, in accordance with a preferred embodiment of the present invention. As shown, an input file 31 is parsed into multiple blocks, each block having a length of n byte words, for the purpose of compression. Each letter (e.g., A, B, C, etc.) within each block of input file 31 represents a set of unique bit patterns. A first dictionary array 32 is generated by the method as detailed in FIG. 1a. Each entry within first dictionary array 32 is again n bytes in length. Each letter within each entry of first dictionary array 32 also represents a set of unique bit patterns.

The number of entries in a mask array 33 is the same as that in first dictionary array 32. The length of each entry in mask array 33 is one bit. Each entry in mask array 33 is set (preferably to a logical "1") when the bit patterns in the corresponding entry within first dictionary array 32 is found in input file 31, as depicted in blocks 23 and 24 in FIG. 1b. In this example, because bit patterns A, B, E, G, H, and L from input file 31 are also found in first dictionary file 32, the corresponding entries in mask array 33 are preferably set to a logical "1," and the corresponding entries in mask array 33 for first dictionary array 32 entries having bit patterns C, D, F, I, J, K are "0."

A second dictionary array 34, as mentioned previously, is a condensed version of first dictionary array 32. Second dictionary array 34 contains only the entries in first dictionary array 32 that have their corresponding entry or entries set in mask array 33.

With the present invention, instead of sending a dictionary file along with the data as part of the compressed output file, a mask array, such as mask array 33, is stored along with the data as part of the compressed output file. During decompression, the first dictionary array can be regenerated utilizing a common available binary file as depicted in FIG. 1a, and the second dictionary array can be regenerated utilizing the mask array within the compressed file. Thus, each index within the compressed file can be located in the second dictionary array for an actual set of corresponding bit patterns, and the compressed file can be restored back to its original form.

Figure 3:
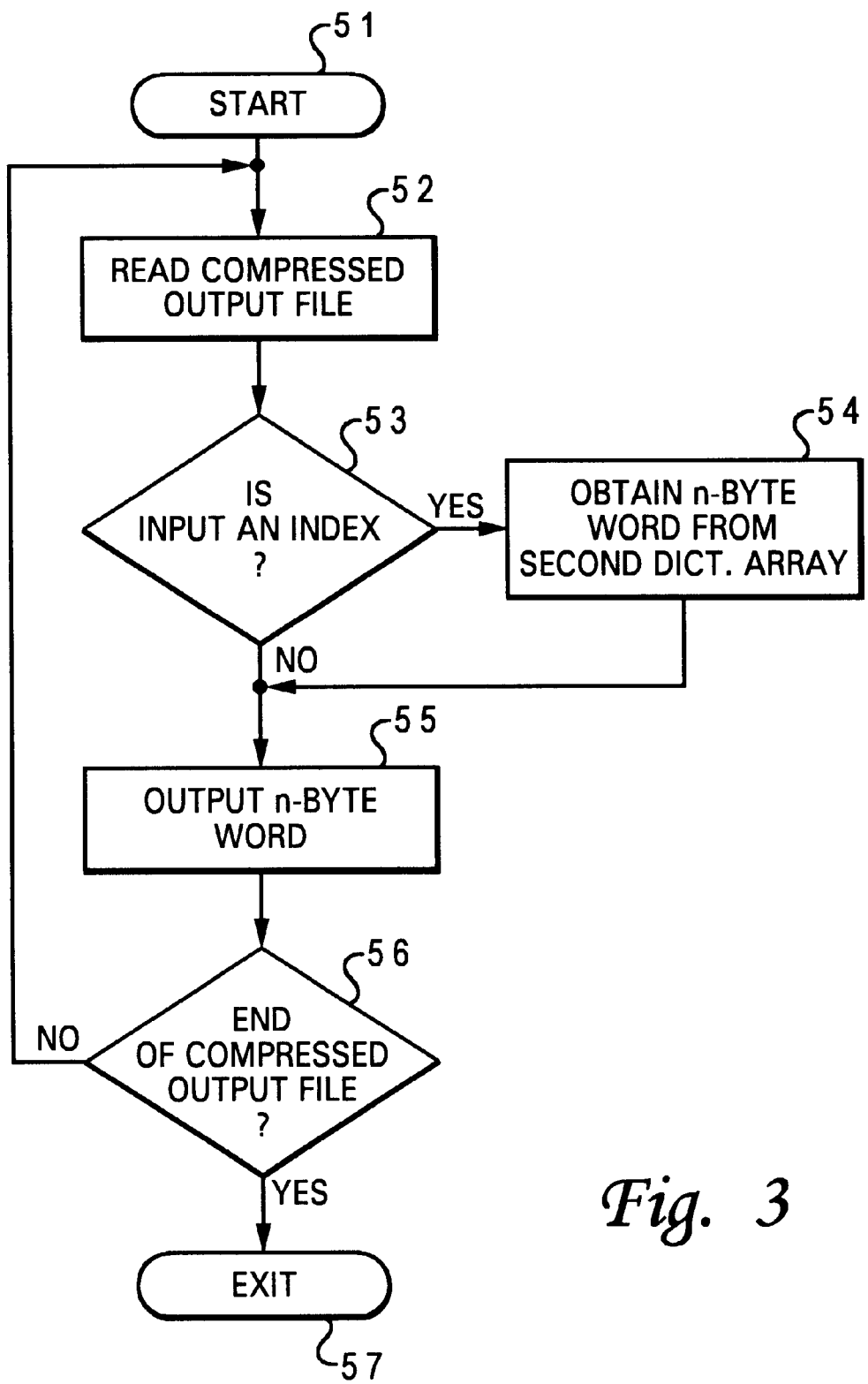
FIG. 3 is a high-level flow diagram of a method for decompressing a compressed output file, in accordance with a preferred embodiment of the present invention.
Figure 4:
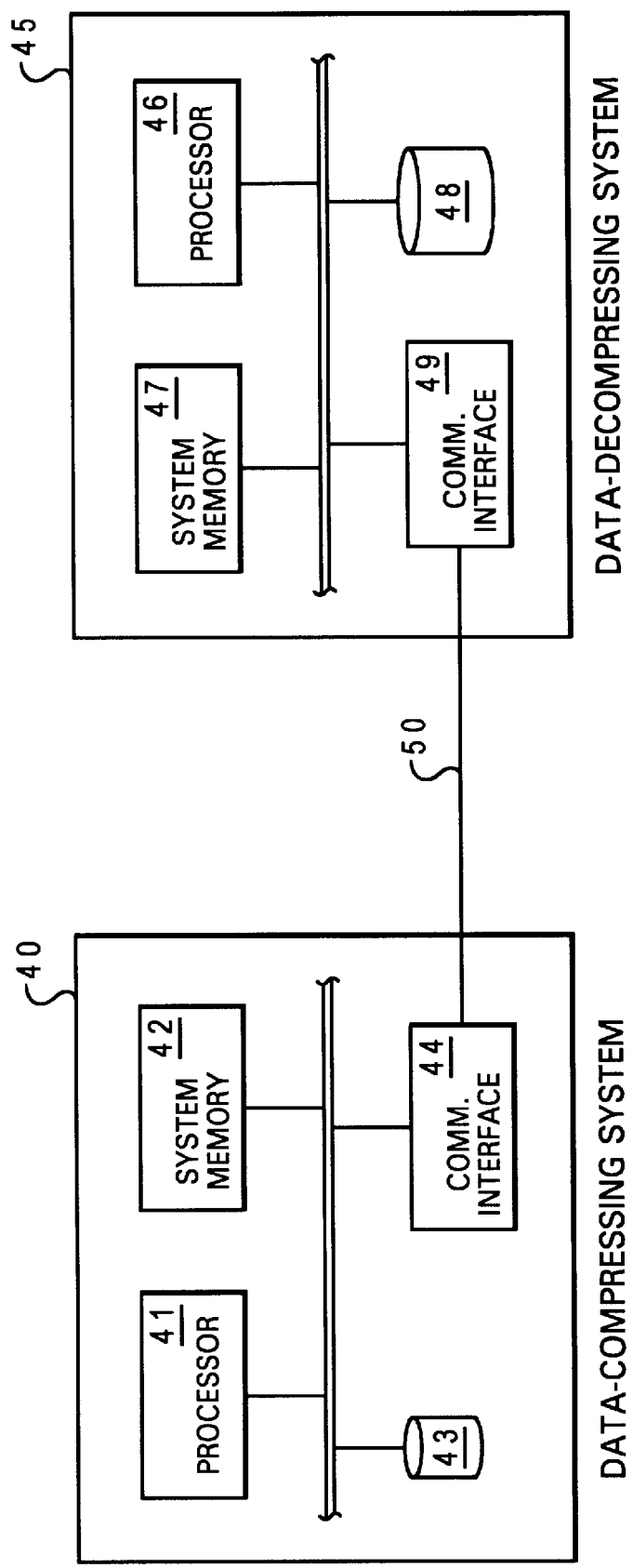
FIG. 4 is a block diagram of a network environment that may be utilized by a preferred embodiment of the present invention.

With reference now to FIG. 3, there is illustrated a high-level flow diagram of a method for decompressing a compressed output file, in accordance with a preferred embodiment of the present invention. Starting at block 51, a word is read from the compressed output file, as shown in block 52. A determination is then made as to whether or not the word is an index to the second dictionary array, as depicted in block 53. If the word is an index to the second dictionary array, the index is utilized to obtain a set of bit patterns from a corresponding n-byte entry within the second dictionary array, as illustrated in block 54. Otherwise, if the word is not an index to the second dictionary array, the word is output directly, as shown in block 55. A determination is made as to whether or not the end of the compressed output file has been reached, as depicted in block 56. If the end of the compressed output file has not been reached, the process returns to block 52; otherwise, the process exits at block 57. The decompression of the compressed output file is completed.

As has been described, the present invention provides an improved dictionary-based method for compressing files. The present invention eliminates the need to save a lengthy dictionary file along with the data as part of a compressed file, thereby increasing the compression ratio. For example, let the input file be 36 bytes in length, the width of bit patterns, n, equal four bytes, the number of four-byte entries in a first dictionary array (i.e., the number of unique bit patterns found in a dictionary file), M, equals 11, the number of entries in a mask array equals the number of entries in the first dictionary array, and the number of four-byte entry in a secondary dictionary file, N, equals 7. The required number of index bits equals $\log_2$ (number of entries in the second dictionary array)=$\log_2 7$=3 bits. The size of the compressed output file=size of the mask array+number of indices*index bits=11+9*3=38 bits=4.75 bytes (note: the bit mask is stored along with the index bits for each compressed file). This implies a compression ratio of 36 bytes/4.75 bytes=7.58 (i.e., 758%). This is just an exemplary scenario and the actual numbers will depend on the input file, the dictionary file, and the choice of n.

The present invention may be applicable to a single computer environment, such as a stand-alone computer system, or to a network environment, such as a local-area network (LAN) or a wide-area network (WAN). Referring now to FIG. 3, there is illustrated a block diagram of a network environment that may be utilized by a preferred embodiment of the present invention. As shown, a data-compressing system 40 is coupled to a data-decompressing system 45 via a network link 50 such as an internet. Data-compressing system 40 includes a processor 41, a system memory 42, a storage device 43, and a communication interface 44. Similarly, data-decompressing system 45 includes a processor 46, a system memory 47, a storage device 48, and a communication interface 49. As the name implies, the compression of an input file is performed within data-compressing system 41 to yield an output file that preferably includes compressed data and a mask array. The output file is then transmitted to data-decompressing system 45 via network link 50, at which the decompression of the output file is performed. The mask array is generated with a dictionary file that is commonly available in both data-compressing system 40 and data-decompressing system 45.

Although the present invention has been described in the context of a network environment, it is important to note that those skilled in the art will appreciate that the mechanisms of the present invention are capable of being implemented in a single computer environment, which includes pervasive computing devices such as palm-top computers and personal digital assistants. It should further be appreciated that the compressed files as well as the present invention itself can be distributed as a program product in a variety of forms, and that the present invention applies equally regardless of the particular type of signal bearing media utilized to actually carry out the distribution. Examples of signal bearing media include, without limitation, recordable type media such as floppy disks or CD ROMs and transmission type media such as analog or digital communications links.

While the invention has been particularly shown and described with reference to a preferred embodiment, it will be understood by those skilled in the art that various changes in form and detail may be made therein without departing from the spirit and scope of the invention.

What is claimed is:

1. A method for compressing files utilizing a dictionary, said method comprising the steps of:

generating a first dictionary array by utilizing a binary file, wherein each entry within said first dictionary array includes a set of unique bit patterns;

parsing an input file into a plurality of blocks, wherein each block has the same length as each entry within said first dictionary array;

marking an entry within said first dictionary array that includes the same bit patterns as a block of said input file;

generating a second dictionary array by extracting all said marked entries from said first dictionary array;

compressing said input file utilizing said second dictionary array; and delivering said output file along with an indication of said selected binary file to said data-decompression system.

2. The method according to claim 1, wherein said binary file is an application file or an operating system component file.

3. The method according to claim 1, wherein said marking step further includes a step of marking an entry of a mask array.

4. The method according to claim 3, wherein said method further includes a step of generating said first dictionary array by utilizing said binary file within a data-decompressing system during decompression.

5. The method according to claim 4, wherein said method further includes a step of generating a second dictionary array by utilizing said mask array in said output file within said data-decompressing system during decompression.

6. The method according to claim 1, wherein said indication of said selected binary file does not include entire said selected binary file.

7. The method according to claim 1, wherein said method further includes steps of:

selecting any one of a plurality of binary files that commonly exist in said data-compression system and said data-decompression system as a dictionary; and compressing said input file utilizing said selected binary file to produce an output file.

8. A data-processing system capable of compressing files utilizing a dictionary, wherein said data-processing system includes a data-compressing system and a data-decompressing system, said data-processing comprising:

means for compressing an input file utilizing a selected binary file to produce an output file, wherein said means for compressing further includes:

means for generating a first dictionary array by utilizing said binary file, wherein each entry within said first dictionary array includes a set of unique bit patterns;

means for parsing said input file into a Plurality of blocks, wherein each block has the same length as each entry within said first dictionary array;

means for marking an entry within said first dictionary array that includes the same bit Patterns as a block of said input file;

means for generating a second dictionary array by extracting all said marked entries from said first dictionary array;

means for compressing said input file utilizing said second dictionary array; and means for delivering said output file along with an indication of said selected binary file to said data-decompression system.

9. The data-processing system according to claim 8, wherein said binary file is an application file or an operating system component file.

10. The data-processing system according to claim 8, wherein said marking means further includes a means for marking an entry of a mask array.

11. The data-processing system according to claim 10, wherein said data-decompressing system further includes a means for generating said first dictionary array by utilizing said binary file within a data-decompressing system during decompression.

12. The data-processing system according to claim 11, wherein said data-decompressing system further includes a step of generating a second dictionary array by utilizing said mask array in said output file within said data-decompressing system during decompression.

13. The data-processing system according to claim 8, wherein said indication of said selected binary file does not include entire said selected binary file.

14. A computer program product residing on a computer usable medium for compressing files utilizing a dictionary, said computer program product comprising:

program code means for compressing an input file utilizing a selected binary file to produce an output file, wherein said program code means for compressing further includes:

program code means for generating a first dictionary array by utilizing said binary file, wherein each entry within said first dictionary array includes a set of unique bit patterns;

program code means for parsing said input file into a plurality of blocks, wherein each block has the same length as each entry within said first dictionary array;

program code means for marking an entry within said first dictionary array that includes the same bit patterns as a block of said input file;

program code means for generating a second dictionary array by extracting all said marked entries from said first dictionary array;

program code means for compressing said input file utilizing said second dictionary array; and program code means for delivering along with an indication of said selected binary file said output file to said data-decompression system.

15. The computer program product according to claim 14, wherein said binary file is an application file or an operating system component file.

16. The computer program product according to claim 14, wherein said program code means for marking further includes program code means for marking an entry of a mask array.

17. The computer program product according to claim 16, wherein said data-decompressing system further includes a program code means for generating said first dictionary array by utilizing said binary file within a data-decompressing system during decompression.

18. The computer program product according to claim 17, wherein said data-decompressing system further includes a program code means for generating a second dictionary array by utilizing said mask array in said output file within said data-decompressing system during decompression.

\* \* \* \* \*